US 10,778,235 B2

(12) United States Patent
Kirschner (10) Patent No.: US 10,778,235 B2
(45) Date of Patent: Sep. 15, 2020

(54) INTERMITTENT TUNING OF AN OSCILLATOR

(71) Applicant: NUVOTON TECHNOLOGY CORPORATION, Hsin-chu (TW)

(72) Inventor: Yuval Kirschner, Even Yehuda (IL)

(73) Assignee: NUVOTON TECHNOLOGY CORPORATION, Hsin-Chu (TW)

(*) Notice: Subject to any disclaimer, the term of this patent is extended or adjusted under 35 U.S.C. 154(b) by 2 days.

(21) Appl. No.: 16/172,797

(22) Filed: Oct. 28, 2018

(65) Prior Publication Data

US 2020/0136629 A1 Apr. 30, 2020

(51) Int. Cl.
*H03L 7/00* (2006.01)
*H03L 7/099* (2006.01)
*H04L 7/033* (2006.01)

(52) U.S. Cl.
CPC .......... *H03L 7/0997* (2013.01); *H03L 7/0992* (2013.01); *H04L 7/033* (2013.01)

(58) Field of Classification Search
CPC ...... H03L 7/0997; H03L 7/0992; H04L 7/033
USPC .......................................................... 331/25
See application file for complete search history.

(56) References Cited

U.S. PATENT DOCUMENTS

| 5,233,314 | A   | * | 8/1993 | McDermott | .......... | H03L 7/0898 |
|           |     |   |        |           |            | 327/157     |
| 5,438,300 | A   |   | 8/1995 | Saban et al. | | |
| 7,027,796 | B1  | * | 4/2006 | Linsky | .................... | H03L 7/193 |
|           |     |   |        |        |                      | 455/343.1  |
| 9,075,585 | B2  | * | 7/2015 | Dinkjian | ................... | H03L 7/08 |
| 2008/0150797 | A1 | * | 6/2008 | Jia | .......................... | G01S 19/34 |
|           |     |   |        |     |                              | 342/357.74 |
| 2016/0157175 | A1 | * | 6/2016 | Yamashiro | ........ | H04W 52/0216 |
|           |     |   |        |           |          | 455/574      |

* cited by examiner

*Primary Examiner* — Richard Tan
(74) *Attorney, Agent, or Firm* — Kligler & Associates Patent Attorneys Ltd (57) ABSTRACT

Described embodiments include a system, including clocked circuitry, an oscillator controller, and an oscillator, configured to output an output clock signal that clocks the clocked circuitry and is fed to the oscillator controller. The oscillator controller is configured to control the oscillator responsively to an output frequency of the output clock signal. The system further includes power-management circuitry, configured to cause the clocked circuitry to sleep by disabling the oscillator, and waking circuitry, configured to intermittently enable the oscillator such that the oscillator controller intermittently, while the clocked circuitry sleeps, causes the output frequency to converge to a target frequency by controlling the oscillator. Other embodiments are also described.

24 Claims, 3 Drawing Sheets

INTERMITTENT TUNING OF AN OSCILLATOR

FIELD OF THE INVENTION

The present invention relates generally to the field of electronic circuits, and particularly to digital circuitry.

BACKGROUND

U.S. Pat. No. 5,438,300 describes a frequency multiplier that includes a ring oscillator having a number of logic gates arranged in a plurality of rings. Control inputs enable the selection of individual gates so as to connect them into the ring or, conversely, remove them from the ring. As additional gates are removed, the combined delay imposed by the gates remaining in the ring is reduced and the frequency of the oscillator increases. A variable delay element, such as a group of tri-state inverters connected in parallel, is connected between two of the gates. The oscillator is fine tuned by controlling the delay inserted by the variable delay element. The frequency multiplier also includes a frequency comparator. A reference frequency is passed through a divide-by-K unit and the output of the ring oscillator is passed through a divide-by-N unit, N being greater than K. The frequency multiplier is coarse-tuned by progressively removing additional gates from the ring oscillator, and then fine-tuned by increasing the delay imposed by the variable delay element. At the conclusion of coarse and fine tuning, the frequency multiplier is locked at a frequency which closely approximates a reference frequency multiplied by N/K. When the frequency multiplier ceases to be hooked on a frequency, it enters an idle state in which it consumes no power.

SUMMARY OF THE INVENTION

There is provided, in accordance with some embodiments of the present invention, a system that includes clocked circuitry, an oscillator controller, and an oscillator, configured to output an output clock signal that clocks the clocked circuitry and is fed to the oscillator controller. The oscillator controller is configured to control the oscillator responsively to an output frequency of the output clock signal. The system further includes power-management circuitry, configured to cause the clocked circuitry to sleep by disabling the oscillator, and waking circuitry, configured to intermittently enable the oscillator such that the oscillator controller intermittently, while the clocked circuitry sleeps, causes the output frequency to converge to a target frequency by controlling the oscillator.

In some embodiments, the target frequency is a predetermined multiple of a reference frequency of a reference clock signal.

In some embodiments, the clocked circuitry includes a central processing unit (CPU).

In some embodiments, the power-management circuitry is configured to disable the oscillator by causing the oscillator controller to sleep, and the waking circuitry is configured to enable the oscillator by waking the oscillator controller.

In some embodiments, the waking circuitry includes a counter configured to periodically wake the oscillator controller for a predetermined wake duration after the oscillator controller has slept for a predetermined sleep duration.

In some embodiments,
the counter is further configured to periodically cause the oscillator controller to sleep, following the predetermined wake duration, by outputting a sleep signal to the oscillator controller, and
the oscillator controller is further configured to:
responsively to the output frequency deviating from the target frequency by more than a first predetermined threshold, inhibit the counter from outputting the sleep signal, such that the oscillator controller remains awake for an extended wake duration that is greater than the predetermined wake duration, and
following the extended wake duration, responsively to the output frequency deviating from the target frequency by less than a second predetermined threshold, cause the counter to output the sleep signal.

In some embodiments, the power-management circuitry is further configured to:
enable the counter when causing the oscillator controller to sleep, and
wake the oscillator controller and, when waking the oscillator controller, disable the counter.

In some embodiments, the system further includes one or more configuration registers configured to store one or more configuration parameters that determine the predetermined sleep duration and the predetermined wake duration, and the counter is configured to read the configuration parameters from the configuration registers.

In some embodiments,
the configuration registers are further configured to store at least one other parameter that determines at least one other duration selected from the group of durations consisting of: another sleep duration, and another wake duration, and
the oscillator controller is further configured to, responsively to the output frequency of the output clock signal, cause the counter to read the at least one other parameter instead of at least one of the configuration parameters.

In some embodiments, the system further includes a sensor configured to sense a change in an ambient temperature,
the configuration registers are further configured to store at least one other parameter that determines at least one other duration selected from the group of durations consisting of: another sleep duration, and another wake duration, and
the sensor is configured to, responsively to the sensed change in the ambient temperature, cause the counter to read the at least one other parameter instead of at least one of the configuration parameters.

In some embodiments, the waking circuitry includes a sensor configured to:
sense a change in an ambient temperature, and
responsively to the sensed change in the ambient temperature, enable the oscillator.

In some embodiments, the oscillator is a first oscillator, and the sensor includes:
a second oscillator, configured to output an oscillating signal having a temperature-sensitive frequency; and
a frequency comparator, configured to sense the change in the ambient temperature by comparing a current value of the temperature-sensitive frequency to a previous value of the temperature-sensitive frequency.

There is further provided, in accordance with some embodiments of the present invention, a method that includes, using an oscillator, outputting an output clock signal that clocks clocked circuitry and is fed to an oscillator controller, and, using the oscillator controller, controlling the oscillator responsively to an output frequency of the output clock signal. The method further includes, using power-management circuitry, causing the clocked circuitry to sleep by disabling the oscillator, and intermittently enabling the oscillator such that the oscillator controller intermittently, while the clocked circuitry sleeps, causes the output frequency to converge to a target frequency by controlling the oscillator.

The present invention will be more fully understood from the following detailed description of embodiments thereof, taken together with the drawings, in which:

DETAILED DESCRIPTION OF EMBODIMENTS

Glossary

In the context of the present application, including the claims, circuitry is said to be "enabled" whenever the circuitry is performing its designated function, and "disabled" whenever the circuitry is not performing its designated function, e.g., by virtue of not being clocked, or by virtue of being logically disabled. For some types of circuitry, particularly if the circuitry consumes a relatively significant amount of power when performing its designated function, the present application may refer to the circuitry as being "awake" when enabled, and "idle" or "sleeping" when disabled.

Overview

Embodiments of the present invention provide a frequency multiplier (FMUL) for clocking a central processing unit (CPU) and/or other digital circuitry. The FMUL comprises a current controlled oscillator (CCO) and an oscillator controller. By continually outputting a control word to the CCO, the oscillator controller drives the CCO to output an output clock signal that clocks the CPU.

More specifically, the FMUL implements a feedback control loop, whereby the output clock signal from the CCO is fed back to the oscillator controller. Based on this feedback, the oscillator controller continually adjusts the control word as required, such that the output frequency f2 of the output clock signal does not deviate significantly from a particular target frequency. For example, the oscillator controller may receive a reference clock signal having a particular reference frequency f1, and control the CCO such that f2 is equal to, or approximately equal to, a target frequency (N/K)*f1, where N/K is a predefined multiplicative factor.

As long as the FMUL is awake, the above-described feedback control loop may be executed without interruption, such that any deviation in the output frequency may be immediately corrected by modifying the control word. However, running the FMUL continuously, even when the CPU is idle, may consume a relatively large amount of power. On the other hand, idling the FMUL whenever the CPU is idle—and hence, interrupting the control loop—may cause the output frequency to deviate significantly from the target frequency upon the waking of the FMUL, e.g., due to a change in the temperature of the CCO while the FMUL was sleeping. Consequently, a relatively large amount of time may be required for the oscillator controller to tune the CCO, i.e., to cause the output frequency to converge to the target frequency.

To address this challenge, embodiments of the present invention allow the FMUL to sleep for most of the time that the CPU is sleeping, but intermittently wake the FMUL for short intervals of time. During these short wake intervals, the output clock signal from the CCO is not fed to the CPU, but is nonetheless fed back to the oscillator controller, such that the oscillator controller may tune the CCO. Thus, the power consumption of the FMUL is limited, yet the output frequency of the FMUL is not allowed to deviate significantly from the target frequency.

Typically, the state of the FMUL while the CPU is idle is controlled by a counter, which outputs periodic wake and sleep signals to the oscillator controller. Typically, the parameters that determine the duration of each periodic wake interval and sleep interval of the FMUL are read, by the counter, from one or more configuration registers. Alternatively or additionally, the FMUL may be woken by a temperature-change sensor, whenever the sensor senses a significant change in the ambient temperature.

In some embodiments, the aforementioned configuration registers store multiple different sets of parameters. In such embodiments, the parameters used by the counter may be varied by the temperature-change sensor, responsively to sensed changes in temperature. Thus, for example, in response to a relatively large change in temperature, the temperature-change sensor may cause the FMUL to have a longer periodic wake interval and/or a shorter periodic sleep interval. Alternatively or additionally, the oscillator controller itself may change the parameters used by the counter, responsively to a detected deviation of the output frequency from the target frequency. Thus, for example, in response to a relatively large deviation, the oscillator controller may cause the FMUL to have a longer periodic wake interval and/or a shorter periodic sleep interval.

System Description

Figure 1:
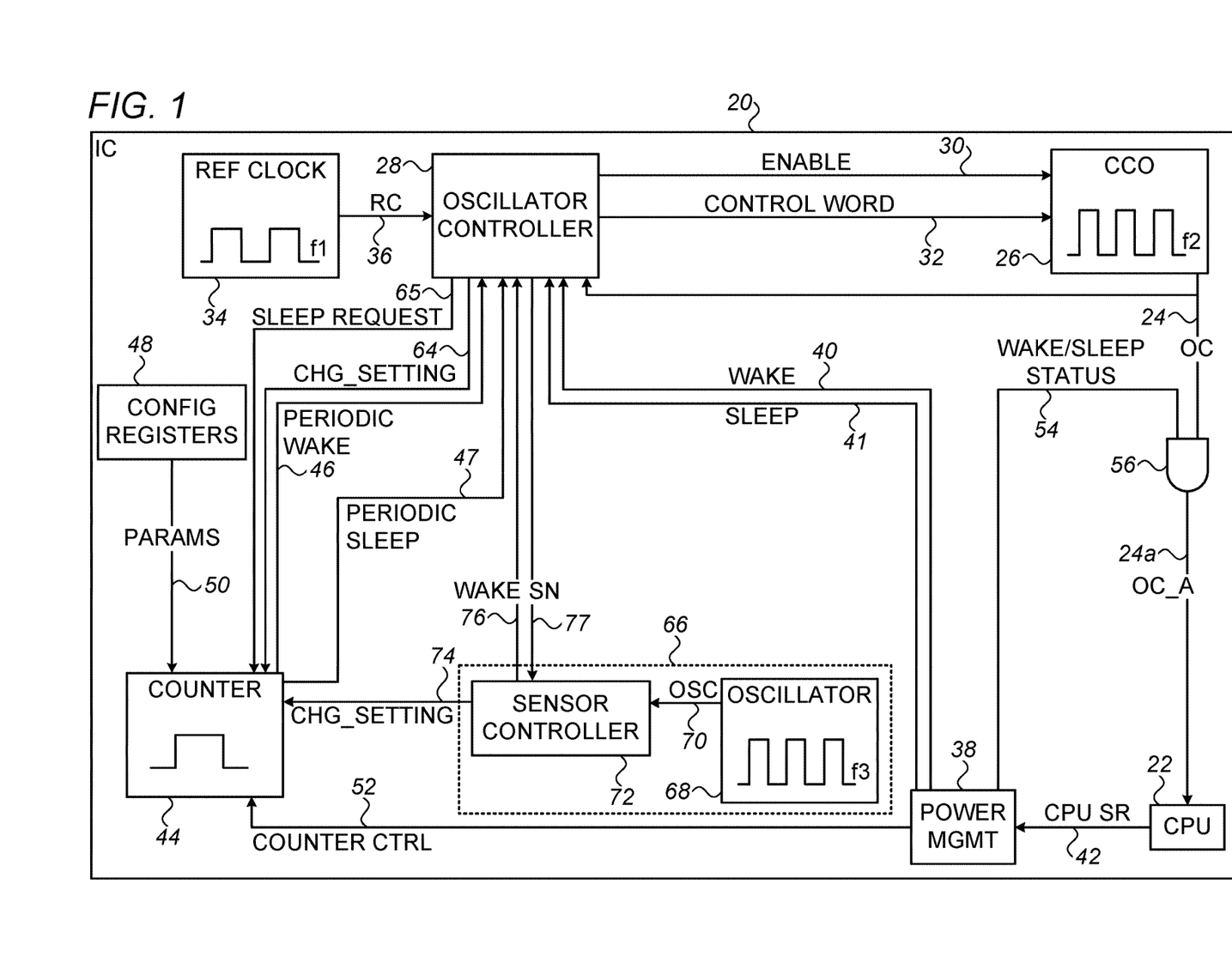
FIG. 1 is a schematic illustration of an integrated circuit, in accordance with some embodiments of the present invention.

Reference is initially made to FIG. 1, which is a schematic illustration of a digital integrated circuit (IC) 20, such as an Application-Specific Integrated Circuit (ASIC) or a Field Programmable Gate Array (FPGA), in accordance with some embodiments of the present invention.

IC 20 comprises a central processing unit (CPU) 22 and an oscillator, such as a CCO 26, which outputs an output clock (OC) signal 24 that clocks CPU 22. In some embodiments, IC 20 is installed on the motherboard of a computer, such as a laptop or desktop computer, and CPU 22 manages various functions of the motherboard. For example, CPU 22 may handle input from one or more external interfaces, including, for example, a keyboard. (In such embodiments, IC 20 may be referred to as a computer microcontroller, or may be said to embody a computer microcontroller.) Alternatively, IC 20 may be installed in any other suitable location (e.g., within a consumer electronics device), and/or CPU 22 may perform any other suitable function. IC 20 may be constructed by a complementary metal-oxide-semiconductor (CMOS) process, or by any other suitable manufacturing process known in the art.

IC 20 further comprises an oscillator controller 28. Oscillator controller 28 controls the frequency f2 of OC signal 24, which varies as a function of the amount of electric current generated within CCO 26. For example, oscillator controller 28 may control frequency f2 by outputting, to the CCO, a multi-bit signal referred to as a "control word" 32, which controls the amount of electric current generated within CCO 26. The oscillator controller may continually modify control word 32 as necessary, in order to keep frequency f2 as close as possible to a particular target frequency. To facilitate this function, OC signal 24 is fed back to the oscillator controller.

Typically, the target frequency for the CCO is a predetermined multiple N/K of the frequency f1 of a reference clock (RC) signal 36, which the oscillator controller continuously receives from a reference clock (REF CLOCK) 34. (In such embodiments, the oscillator controller and the CCO may be referred to as respective components of an FMUL.) Typically, the oscillator controller comprises two frequency dividers and a frequency comparator, which the oscillator controller uses to compare frequency f2 to the target frequency (N/K)*f1. For example, the oscillator controller may divide f2 by N using one frequency divider, divide f1 by K using the other frequency divider, and compare the two resulting quantities to one another using the frequency comparator. If the two quantities are not equal to one another, the oscillator controller may alter the control word, so as to increase or decrease f2. Alternatively, the oscillator controller may use any other suitable logic—and in so doing, use any suitable circuitry—to control the output frequency of the CCO.

Typically, in addition to control word 32, oscillator controller 28 outputs, to CCO 26, a single-bit enable signal 30. When enable signal 30 is high, the CCO is enabled; otherwise, the CCO is disabled, and hence, the CPU is not clocked. In general, the enable signal is high whenever the oscillator controller is awake, and is low whenever the oscillator controller is idle. Hence, as assumed in the description below, the CCO may be disabled by idling the oscillator controller, and enabled by waking the oscillator controller.

IC 20 further comprises power-management (POWER MGMT) circuitry 38, which controls the state of CPU 22. Typically, power-management circuitry 38 causes CPU 22 to sleep by disabling the CCO, such that CCO 26 stops outputting OC signal 24. Typically, the power-management circuitry disables the CCO by outputting, to the oscillator controller, a sleep pulse 41, which causes the oscillator controller to sleep, such that enable signal 30 goes low. Conversely, to wake the CPU, power-management circuitry 38 outputs a wake pulse 40 to the oscillator controller, thus waking the oscillator controller. (Typically, as depicted in FIG. 1, sleep pulse 41 and wake pulse 40 are sent over different respective lines.)

Typically, the power-management circuitry causes the CPU to sleep responsively to a CPU sleep request (CPU SR) signal 42 received from the CPU. The CPU may generate CPU SR signal 42 in response to any suitable factors; for example, for embodiments in which IC 20 embodies a computer microcontroller, the CPU may generate SR signal 42 in response to no input having been received from any external interface for a predetermined duration of time. Subsequently to causing the CPU to sleep, the power-management circuitry may wake the CPU after a predetermined duration of time, or in response to any other suitable factors. For example, the power-management circuitry may be connected to an external interface (such as a keyboard), and may wake the CPU whenever an input is received from the interface.

As described above in the Overview, were the oscillator controller and CCO to be disabled uninterruptedly while the CPU sleeps, frequency f2 might deviate significantly from the target frequency. Hence, IC 20 further comprises waking circuitry, configured to intermittently enable the oscillator controller and CCO while the CPU sleeps. While the oscillator controller and CCO are enabled, the oscillator controller causes frequency f2 to converge to the target frequency, by controlling the CCO as described above.

Typically, the waking circuitry comprises a counter 44, configured to periodically wake the oscillator controller (and hence, also enable the CCO) for a predetermined wake duration after the oscillator controller has slept for a predetermined sleep duration. Counter 44 comprises a clock, which oscillates with a particular periodicity, along with other circuitry, configured to implement the functionality described herein.

In some embodiments, to periodically wake the oscillator controller, counter 44 outputs a periodic wake pulse 46 to the oscillator controller. Conversely, to idle the oscillator controller following each periodic wake duration, the counter outputs a periodic sleep pulse 47 to the oscillator controller. (Typically, as depicted in FIG. 1, wake pulse 46 and sleep pulse 47 are sent over different respective lines.) Typically, the periodic wake duration of the oscillator controller is much shorter than (e.g., shorter than 1% of) the periodic sleep duration of the oscillator controller. For example, while the sleep duration may be 200-1000 ms, the wake duration may be only 0.1-0.5 ms.

Typically, to ensure that counter 44 does not cause the oscillator controller to sleep while the CPU is awake, the state of the counter is controlled by the power-management circuitry. In particular, whenever the power-management circuitry wakes the CPU, the power-management circuitry also disables the counter; conversely, whenever the power-management circuitry causes the CPU to sleep, the power-management circuitry enables the counter. This functionality may be implemented, for example, using a one-bit counter control (COUNTER CTRL) signal 52, which is toggled to high whenever sleep pulse 41 is communicated to the oscillator controller, and to low whenever wake pulse 40 is communicated to the oscillator controller.

Typically, power-management circuitry 38 also prevents the counter from waking the CPU. The power-management circuitry may implement this functionality by outputting a one-bit wake/sleep status signal 54, which controls the input of OC signal 24 to CPU 22.

For example, wake/sleep status signal 54 may be input, along with OC signal 24, to an AND gate 56, which outputs an OC_A signal 24a. When wake/sleep status signal 54 is high, OC signal 24 passes through AND gate 56, such that OC_A signal 24a is equal to OC signal 24, and hence, CPU 22 is clocked. Otherwise, although OC signal 24 is fed back to oscillator controller 28, the OC signal is not fed to the CPU, i.e., OC_A signal 24a is low, and hence, the CPU is not clocked. Wake/sleep status signal 54 may thus be toggled to high whenever wake pulse 40 is communicated to the oscillator controller, and to low whenever sleep pulse 41 is communicated to the oscillator controller. (Wake/sleep status signal 54 may thus be the negation of counter control signal 52.)

Typically, one or more configuration registers (CONFIG REGISTERS) 48 store one or more configuration parameters (PARAMS) 50 that determine the periodic sleep duration and wake duration of the oscillator controller. The counter reads configuration parameters 50 from configuration registers 48 and, in response to these parameters, wakes the oscillator controller in accordance with the designated durations.

For example, registers 48 may store a first number of counter cycles N1, which determines the wake duration, and a second number of counter cycles N2, which determines the sleep duration. In response to reading these parameters, the counter, following each periodic wake pulse, may wait N1 counter cycles before sending a periodic sleep pulse to the oscillator controller, and then wait N2 counter cycles before sending the next periodic wake pulse to the oscillator controller.

State Transitions

Figure 2:
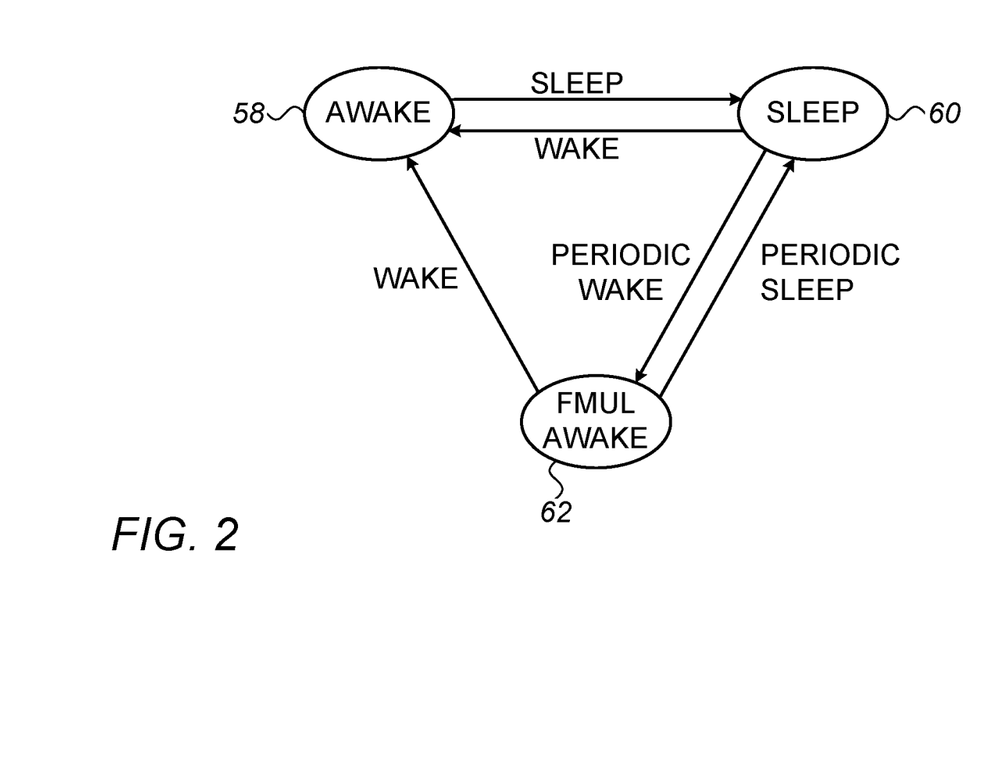
FIG. 2 is a state diagram for the integrated circuit of FIG. 1, in accordance with some embodiments of the present invention.
Figure 3:
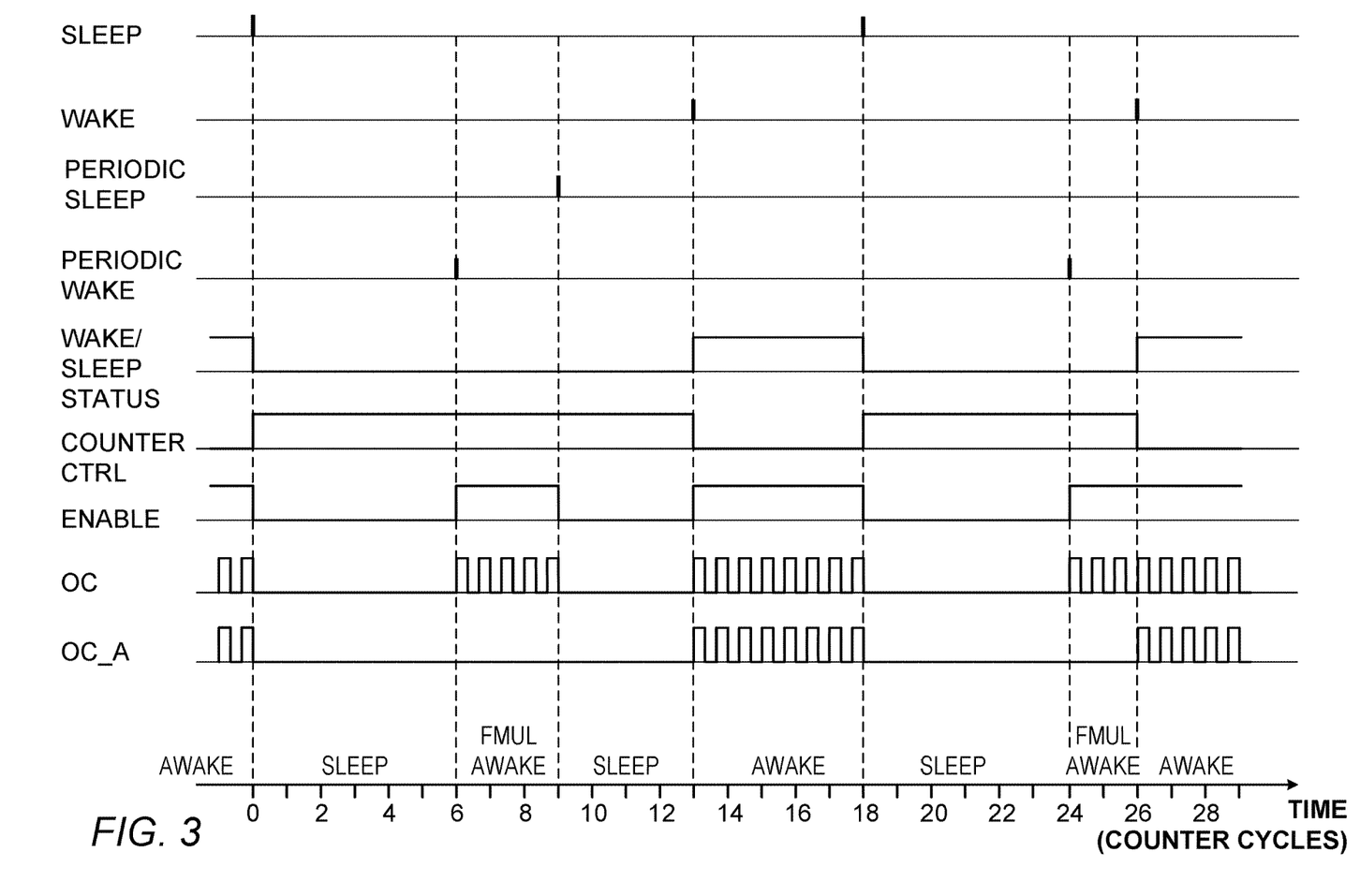
FIG. 3 shows an example sequence of state transitions for the integrated circuit of FIG. 1, in accordance with some embodiments of the present invention.

Reference is now made to FIG. 2, which is a state diagram for IC 20, in accordance with some embodiments of the present invention. Reference is additionally made to FIG. 3, which shows an example sequence of state transitions for IC 20, in accordance with some embodiments of the present invention. (For convenience, FIGS. 2-3 refer to the CCO and oscillator controller collectively as an FMUL.)

As shown in FIG. 2, IC 20 generally has three different states: (i) an awake state 58, during which the FMUL and the CPU are both awake while the counter is disabled, (ii) a sleep state 60, during which the FMUL and CPU are both idle while the counter is enabled, and (iii) an FMUL awake state 62, during which the counter is enabled, the FMUL is awake, and the CPU is idle. As described above with reference to FIG. 1, wake pulse 40 transitions IC 20 to awake state 58, while sleep pulse 41 transitions IC 20 from the awake state to sleep state 60. As further described above, transitions between sleep state 60 and FMUL awake state 62 are effected by periodic wake pulses 46 and periodic sleep pulses 47.

The following is a description of the example sequence of state transitions shown in FIG. 3. In the timeline of FIG. 3, time (indicated below by the letter "t") is marked in units of cycles of counter 44, such that, for example, an event that occurs following six cycles of the counter is described as occurring at t=6.

(For ease of illustration and description, FIG. 3 assumes a periodic sleep duration of six counter cycles, and a periodic wake duration of three counter cycles. It is emphasized, however, that in practice, the cycle length of the counter is typically relatively small (e.g., less than 5 μs), such that the number of counter cycles in each sleep or wake duration is much greater than assumed in FIG. 3. Moreover, as noted above, the ratio of the wake duration to the sleep duration is typically much smaller than is assumed in FIG. 3.)

First, at t=0, the power-management circuitry sends a sleep pulse to the FMUL and toggles counter control signal 52 to high, thus causing the IC to transition from the awake state to the sleep state. In particular, the sleep pulse disables the oscillator controller, such that enable signal 30 drops to low, and hence, OC signal 24 and OC_A signal 24*a* both go to low (such that the CPU sleeps), while the counter control signal enables the counter. The power-management circuitry further toggles wake/sleep status signal 54 to low.

Next, following six counter cycles, a periodic wake pulse is sent to the FMUL by the counter, causing the IC to transition to the FMUL awake state. During this state, the enable signal is high, and hence, OC signal 24 oscillates at frequency f2. (Frequency f2 may be adjusted, as necessary, such that it converges to the target frequency.) Since, however, wake/sleep status signal 54 is low, the OC_A signal remains low, and hence, the CPU continues to sleep.

After three more counter cycles, the counter sends a periodic sleep pulse to the FMUL, causing the IC to transition back to the sleep state. This period of sleep is interrupted at t=13 by a wake pulse from the power-management circuitry, which causes the IC to transition to the awake state. Another sleep pulse at t=18 transitions the IC back to the sleep state. After six more counter cycles, another periodic wake signal transitions the IC to the FMUL awake state. Finally, at t=26, another wake pulse transitions the IC back to the awake state.

Operating at Different Settings

Reference is again made to FIG. 1.

In some embodiments, configuration registers 48 store multiple different values for one or more of the configuration parameters. In other words, the configuration registers may store multiple parameters that determine different respective sleep durations for the oscillator controller, and/or multiple parameters that determine different respective wake durations for the oscillator controller. In such embodiments, responsively to frequency f2 of OC signal 24, oscillator controller 28 may output, to counter 44, a first change-setting (CHG_SETTING) signal 64, which causes the counter to change at least one of the parameters that is read from the registers.

For example, the configuration registers may store two sets of parameters: (i) a default set of parameters {N1_a, N2_a}, corresponding to a periodic wake duration of N1_a counter cycles and a periodic sleep duration of N2_a counter cycles, and (ii) a corrective set of parameters {N1_b, N2_b}, corresponding to a periodic wake duration of N1_b counter cycles and a periodic sleep duration of N2_b counter cycles, where N1_b>N1_a and/or N2_b<N2_a. By default, the counter may use the default set of parameters. If, however, at any point during one of the wake periods, the oscillator controller ascertains that frequency f2 deviates from the target frequency by more than a predefined threshold, the oscillator controller may cause the counter to use the corrective set of parameters. Subsequently, the oscillator controller may ascertain that the deviation has been less than the predefined threshold for at least a threshold period of time (e.g., 0.5-2 seconds), and, in response thereto, cause the counter to revert to the default set of parameters.

In some embodiments, the oscillator controller computes the deviation as the absolute difference between frequency f2 and the target frequency, divided by the target frequency, and the threshold is defined as a suitable percentage of the target frequency, such as between 0.5% and 1% of the target frequency.

Alternatively or additionally, responsively to the output frequency deviating from the target frequency by more than a first predetermined threshold (e.g., 0.75%-1.25% of the target frequency), the oscillator controller may inhibit the counter from outputting sleep pulse 47, such that the oscillator controller remains awake for an extended wake duration that is greater than the predetermined wake duration that was read from the configuration registers. Subsequently, responsively to the output frequency deviating from the target frequency by less than a second, lower predetermined threshold (e.g., 0.05%-0.15% of the target frequency), the oscillator controller may cause the counter to output sleep pulse 47. (In such embodiments, due to the varying wake durations of the oscillator controller, sleep pulse 47 and wake pulse 46 are not necessarily periodic.)

For example, during any particular wake period, the oscillator controller may compute the deviation of the output frequency from the target frequency, as described above. If the deviation is greater than the first threshold, the oscillator controller may, by outputting an appropriate change-setting signal 64, switch the counter to a hyper-corrective setting, in which —although the sleep duration of the oscillator controller is as before —the counter does not output a sleep pulse without first receiving a request to do so from the oscillator controller. Subsequently, upon ascertaining that the deviation is less than the second threshold, the oscillator controller may output a sleep request pulse 65. In response to sleep request pulse 65, the counter may output sleep pulse 47, thus causing the oscillator controller to sleep. The duration of the wake period —along with that of any number of subsequent wake periods —may thus be extended for as long as is necessary for convergence of the output frequency to the target frequency.

Upon ascertaining that the deviation has been less than the first threshold for at least a threshold period of time (e.g., 0.5-2 seconds), the oscillator controller may, by outputting an appropriate change-setting signal, cause the counter to leave the hyper-corrective setting.

Alternatively to switching the counter to the hyper-corrective setting, the oscillator controller may inhibit the periodic sleep pulses on an ad-hoc basis. In other words, during each wake period in which the deviation exceeds the first threshold, the oscillator controller may inhibit sleep pulse 47, e.g., by outputting an appropriate sleep-pulse-inhibiting signal (not shown) to the counter, such that the wake period is extended for as long as is necessary for convergence of frequency f2.

In general, any suitable number of counter settings may be defined, each setting corresponding to a different respective range of values for the deviation between f2 and the target frequency. In some embodiments, as assumed in FIG. 1 and in the description above, the oscillator controller, after computing the deviation, looks up the corresponding setting in a lookup table (stored, for example, in a separate register), and then communicates the setting to the counter using first change-setting signal 64. (First change-setting signal 64 may comprise any suitable number of bits, such that the signal is capable of specifying each one of the settings.) In other embodiments, the oscillator controller communicates the deviation to the counter, and the counter then looks up the corresponding setting.

For example, three settings may be defined for the counter: the default, corrective, and hyper-corrective settings described above, each specified by a different respective two-bit value of change-setting signal 64. If the absolute difference between f2 and the target frequency exceeds a first threshold, the hyper-corrective setting may be used. Otherwise, if the absolute difference exceeds a second, lower threshold, the corrective setting may be used. Otherwise, the default setting may be used. As a purely illustrative example, the first threshold may be between 0.75% and 1.25% of the target frequency, while the second threshold may be between 0.5% and 1% of the target frequency.

In some embodiments, the counter does not use a predetermined wake duration in any setting; rather, the counter outputs sleep pulse 47 only in response to sleep request signal 65.

Typically, the primary cause for frequency f2 deviating from the target frequency is a change in the ambient temperature, which affects the temperature of CCO 26. Hence, in some embodiments, IC 20 comprises a sensor 66 configured to sense changes in the ambient temperature of the circuit, and to change the setting of counter 44 responsively thereto. Thus, sensor 66 may cause the counter to operate in the hyper-corrective setting, and/or change the parameters that are read by counter 44 from the configuration registers. For example, if the sensor senses an increase or a decrease in temperature that exceeds a predefined threshold, the sensor may cause the counter to read a higher wake duration and/or a lower sleep duration. Subsequently, after the ambient temperature has stabilized, the sensor may cause the counter to revert to the previous parameters.

In some embodiments, sensor 66 comprises a second oscillator 68, comprising, for example, a current-controlled oscillator or a resistor-capacitor (RC) oscillator, and a sensor controller 72, comprising a frequency comparator and one or more registers. Second oscillator 68 continuously outputs an oscillating (OSC) signal 70 having a temperature-sensitive frequency f3, and sensor controller 72, using the frequency comparator, identifies changes in the ambient temperature by tracking frequency f3.

For example, sensor controller 72 may periodically (e.g., 1-5 times per second) sample the current value of frequency f3, and compare this value to a previous value, such as the most recently sampled value, of frequency f3 that is stored in the registers of the sensor controller. (In some embodiments, the sensor controller computes a moving average of frequency f3, and compares the moving average with a previous moving average.) If the absolute or percentage difference between the two values exceeds a particular predefined threshold, the sensor controller may output a second change-setting signal 74 to counter 44, thus changing the setting of the counter to a more corrective setting. Subsequently, upon identifying that frequency f3 has stabilized (i.e., that the absolute or percentage difference is less than the threshold), the sensor controller may output another change-setting signal to the counter, thus changing the setting of the counter to a less corrective setting.

As a purely illustrative example, assuming the three counter settings defined above, and assuming that changes in frequency f3 are computed over respective one-second periods, sensor controller 72 may cause the counter to operate on the default setting if the change in f3 is less than 1%, the corrective setting if the change is between 1% and 2%, and the hyper-corrective setting if the change is greater than 2%.

In the event that the setting specified by second change-setting signal 74 conflicts with the setting specified by first change-setting signal 64, the counter generally uses the more corrective setting. For example, if the second change-setting signal specifies the corrective setting but the first change-setting signal specifies the hyper-corrective setting, the counter will typically choose the hyper-corrective setting.

It is noted that, in contrast to CCO 26, second oscillator 68 consumes relatively little power, such that it is relatively inexpensive to operate the second oscillator continuously. For example, second oscillator 68 may be less precise than CCO 26, and/or frequency f3 may be lower than frequency f2, such that second oscillator 68 consumes relatively little power. Nonetheless, frequency f3 is generally affected by temperature similarly to frequency f2, such that a detected change in frequency f3 functions as a proxy for the expected change in frequency f2.

Other Embodiments

In some embodiments, sensor 66 is configured to wake the oscillator controller, responsively to a relatively large sensed change in temperature. For example, sensor controller 72 may continuously output, to the oscillator controller, a wake signal 76, which is usually low, but is toggled to high responsively to a relatively large sensed change in temperature. While wake signal 76 is low, oscillator controller 28 functions in accordance with the periodic (and/or non-periodic) wake and sleep pulses received from counter 44, as described above. On the other hand, while wake signal 76 is high, oscillator controller 28 remains awake, even if a sleep pulse is received from counter 44.

In such embodiments, oscillator controller 28 typically outputs a sleep notification (SN) pulse 77 to sensor controller 72, immediately prior to going to sleep (e.g., responsively to a sleep pulse received from the power-management circuitry or counter). In response to receiving sleep notification pulse 77, sensor controller 72 stores, in its registers, the most recently sampled value of frequency f3, which is designated as the baseline frequency value. Subsequently, the sensor controller compares each sampled value of frequency f3 to the baseline value. If the absolute or percentage difference between the two values exceeds a particular predefined threshold, sensor controller 72 toggles wake signal 76 to high. The oscillator controller then remains awake, until the next sleep pulse is received from the power-management circuitry. Upon receiving this sleep pulse, the oscillator controller sends another sleep notification pulse to the sensor controller. In response thereto, the sensor controller toggles wake signal 76 to low, and stores the new baseline frequency value.

In some embodiments, wake signal 76 is used in parallel with second change-setting signal 74. For example, sensor controller 72 may compare each frequency sample with both (i) a recent sample, such as the most recent sample, and (ii) the baseline frequency value. If the latter comparison identifies a sufficiently-high change in frequency f3, wake signal 76 is toggled to high, as explained above. Otherwise, wake signal 76 remains low; if necessary, however, the counter setting is changed, based on the former comparison.

In other embodiments, sensor 66 does not output second change-setting signal 74, but rather, only wake signal 76. In such embodiments, IC 20 need not necessarily comprise counter 44, i.e., the FMUL awake state may be triggered solely by sensor 66.

Alternatively or additionally to oscillator 68 and sensor controller 72, sensor 66 may comprise any other suitable components, such as a thermal diode or a thermistor, that directly measure the ambient temperature. Analogously to the above, several ranges for the change in temperature, corresponding to different respective counter settings, may be defined. Thus, as a purely illustrative example, a change in temperature, over a period of one second, of less than 1° C. may correspond to the default setting, a change of between 1° C. and 2° C. may correspond to the corrective setting, while a change larger than 2° C. may correspond to the hyper-corrective setting. Alternatively or additionally, sensor 66 may store a reference temperature in response to sleep notification pulse 77, and then toggle wake signal 76 —thus waking the oscillator controller —in response to comparing the current temperature with the reference temperature.

It is noted that the scope of the present invention includes any other suitable modification to the composition and configuration of the circuitry shown in FIG. 1. For example, instead of CCO 26, IC 20 may comprise any other suitable type of oscillator, such as a ring oscillator in which the ring length of the oscillator, which determines the output frequency of the oscillator, is controlled (or "tuned") by oscillator controller 28. As another example, alternatively or additionally to CPU 22, IC 20 may comprise any other digital circuitry that is clocked by OC signal 24, such as a digital-to-analog (D/A) converter, which may, for example, convert digital audio to analog audio.

The scope of the present invention further includes any suitable modification to the manner in which the various components of IC 20 signal each other. For example, the state of oscillator controller 28 may be controlled by continuous signals output by the power-management circuitry and/or the counter, alternatively to one or more of the wake and sleep pulses described above. As another example, functionality described above as being implemented when a particular signal is high may alternatively be implemented when the signal is low, and vice versa.

In general, each element of circuitry described herein may include any suitable arrangement of interconnected components, configured to perform the functionality described herein. These components may include, for example, resistors, transistors, capacitors, inductors, and/or diodes, which may be interconnected using any suitable wires and/or traces.

It will be appreciated by persons skilled in the art that the present invention is not limited to what has been particularly shown and described hereinabove. Rather, the scope of embodiments of the present invention includes both combinations and subcombinations of the various features described hereinabove, as well as variations and modifications thereof that are not in the prior art, which would occur to persons skilled in the art upon reading the foregoing description. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A system, comprising:
  clocked circuitry;
  an oscillator controller;
  an oscillator, configured to output an output clock signal that clocks the clocked circuitry and is fed to the oscillator controller,
    the oscillator controller being configured to control the oscillator responsively to an output frequency of the output clock signal;
  power-management circuitry, configured to cause the clocked circuitry to sleep by disabling the oscillator; and
  waking circuitry, configured to enable the oscillator for one or more wake periods occurring while the clocked circuitry sleeps and ending before the clocked circuitry reawakens, the oscillator being disabled at an end of each of the wake periods, such that the oscillator controller, during each of the wake periods, causes the output frequency to converge to a target frequency by controlling the oscillator.

2. The system according to claim 1, wherein the target frequency is a predetermined multiple of a reference frequency of a reference clock signal.

3. The system according to claim 1, wherein the clocked circuitry comprises a central processing unit (CPU).

4. The system according to claim 1, wherein the power-management circuitry is configured to disable the oscillator by causing the oscillator controller to sleep, and wherein the waking circuitry is configured to enable the oscillator by waking the oscillator controller.

5. The system according to claim 4, wherein the waking circuitry comprises a counter configured to periodically wake the oscillator controller for a predetermined wake duration after the oscillator controller has slept for a predetermined sleep duration.

6. The system according to claim 5,
wherein the counter is further configured to periodically cause the oscillator controller to sleep, following the predetermined wake duration, by outputting a sleep signal to the oscillator controller, and
wherein the oscillator controller is further configured to:
responsively to the output frequency deviating from the target frequency by more than a first predetermined threshold, inhibit the counter from outputting the sleep signal, such that the oscillator controller remains awake for an extended wake duration that is greater than the predetermined wake duration, and
following the extended wake duration, responsively to the output frequency deviating from the target frequency by less than a second predetermined threshold, cause the counter to output the sleep signal.

7. The system according to claim 5, wherein the power-management circuitry is further configured to:
enable the counter when causing the oscillator controller to sleep, and
wake the oscillator controller and, when waking the oscillator controller, disable the counter.

8. The system according to claim 5, further comprising one or more configuration registers configured to store one or more configuration parameters that determine the predetermined sleep duration and the predetermined wake duration, wherein the counter is configured to read the configuration parameters from the configuration registers.

9. The system according to claim 8,
wherein the configuration registers are further configured to store at least one other parameter that determines at least one other duration selected from the group of durations consisting of: another sleep duration, and another wake duration, and
wherein the oscillator controller is further configured to, responsively to the output frequency of the output clock signal, cause the counter to read the at least one other parameter instead of at least one of the configuration parameters.

10. The system according to claim 8, further comprising a sensor configured to sense a change in an ambient temperature,
wherein the configuration registers are further configured to store at least one other parameter that determines at least one other duration selected from the group of durations consisting of: another sleep duration, and another wake duration, and
wherein the sensor is configured to, responsively to the sensed change in the ambient temperature, cause the counter to read the at least one other parameter instead of at least one of the configuration parameters.

11. The system according to claim 1, wherein the waking circuitry comprises a sensor configured to:
sense a change in an ambient temperature, and
responsively to the sensed change in the ambient temperature, enable the oscillator.

12. The system according to claim 11, wherein the oscillator is a first oscillator, and wherein the sensor comprises:
a second oscillator, configured to output an oscillating signal having a temperature-sensitive frequency; and
a frequency comparator, configured to sense the change in the ambient temperature by comparing a current value of the temperature-sensitive frequency to a previous value of the temperature-sensitive frequency.

13. A method, comprising:
using an oscillator, outputting an output clock signal that clocks clocked circuitry and is fed to an oscillator controller;
using the oscillator controller, controlling the oscillator responsively to an output frequency of the output clock signal;
using power-management circuitry, causing the clocked circuitry to sleep by disabling the oscillator; and
enabling the oscillator for one or more wake periods occurring while the clocked circuitry sleeps and ending before the clocked circuitry reawakens, the oscillator being disabled at an end of each of the wake periods, such that the oscillator controller, during each of the wake periods, causes the output frequency to converge to a target frequency by controlling the oscillator.

14. The method according to claim 13, wherein the target frequency is a predetermined multiple of a reference frequency of a reference clock signal.

15. The method according to claim 13, wherein the clocked circuitry comprises a central processing unit (CPU).

16. The method according to claim 13, wherein disabling the oscillator comprises disabling the oscillator by causing the oscillator controller to sleep, and wherein enabling the oscillator comprises enabling the oscillator by waking the oscillator controller.

17. The method according to claim 16, wherein waking the oscillator controller comprises, using a counter, periodically waking the oscillator controller for a predetermined wake duration after the oscillator controller has slept for a predetermined sleep duration.

18. The method according to claim 17, further comprising:
using the counter, periodically causing the oscillator controller to sleep, following the predetermined wake duration, by outputting a sleep signal to the oscillator controller;
using the oscillator controller, responsively to the output frequency deviating from the target frequency by more than a first predetermined threshold, inhibiting the counter from outputting the sleep signal, such that the oscillator controller remains awake for an extended wake duration that is greater than the predetermined wake duration; and
following the extended wake duration, using the oscillator controller, responsively to the output frequency deviating from the target frequency by less than a second predetermined threshold, causing the counter to output the sleep signal.

19. The method according to claim 17, further comprising:
using the power-management circuitry, enabling the counter when causing the oscillator controller to sleep; and
using the power-management circuitry, waking the oscillator controller and, when waking the oscillator controller, disabling the counter.

20. The method according to claim 17, further comprising:
storing, in one or more configuration registers, one or more configuration parameters that determine the predetermined sleep duration and the predetermined wake duration; and
using the counter, reading the configuration parameters from the configuration registers.

21. The method according to claim 20, further comprising:
- storing, in the configuration registers, at least one other parameter that determines at least one other duration selected from the group of durations consisting of: another sleep duration, and another wake duration; and
- using the oscillator controller, responsively to the output frequency of the output clock signal, causing the counter to read the at least one other parameter instead of at least one of the configuration parameters.

22. The method according to claim 20, further comprising:
- storing, in the configuration registers, at least one other parameter that determines at least one other duration selected from the group of durations consisting of: another sleep duration, and another wake duration; and
- using a sensor, sensing a change in an ambient temperature, and, responsively to the sensed change in the ambient temperature, causing the counter to read the at least one other parameter instead of at least one of the configuration parameters.

23. The method according to claim 13, wherein enabling the oscillator comprises:
- sensing a change in an ambient temperature; and
- responsively to the sensed change in the ambient temperature, enabling the oscillator.

24. The method according to claim 23, wherein the oscillator is a first oscillator, and wherein sensing the change in the ambient temperature comprises:
- using a second oscillator, outputting an oscillating signal having a temperature-sensitive frequency; and
- sense the change in the ambient temperature by comparing a current value of the temperature-sensitive frequency to a previous value of the temperature-sensitive frequency.

* * * * *